US009961288B2

(12) United States Patent
Yu

(10) Patent No.: US 9,961,288 B2
(45) Date of Patent: May 1, 2018

(54) IMAGE SENSOR AND IMAGING DEVICE COMPRISING OVERSAMPLING AD CONVERTER AND RECURSIVE AD CONVERTER

(71) Applicant: PANASONIC INTELLECTUAL PROPERTY MANAGEMENT CO., LTD., Osaka (JP)

(72) Inventor: Tianyi Yu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/474,524

(22) Filed: Mar. 30, 2017

(65) Prior Publication Data
US 2017/0208285 A1  Jul. 20, 2017

Related U.S. Application Data

(63) Continuation of application No. PCT/JP2016/000101, filed on Jan. 12, 2016.

(30) Foreign Application Priority Data

Mar. 19, 2015  (JP) ................. 2015-056404

(51) Int. Cl.
*H04N 3/14* (2006.01)
*H04N 5/335* (2011.01)
(Continued)

(52) U.S. Cl.
CPC ....... *H04N 5/37455* (2013.01); *H04N 5/3575* (2013.01); *H04N 5/3765* (2013.01)

(58) Field of Classification Search
CPC .......... H03M 1/12; H03M 3/424; H03M 1/68; H03M 3/00; H03M 1/124; H03M 1/14;
(Continued)

(56) References Cited

U.S. PATENT DOCUMENTS 5,396,247 A * 3/1995 Watanabe ............. G04F 10/005
341/157
6,188,347 B1 * 2/2001 Knudsen ................. G06F 7/607
341/159
(Continued)

FOREIGN PATENT DOCUMENTS

JP    2003-259151 A    9/2003
JP    4219341 B2    2/2009
(Continued)

OTHER PUBLICATIONS

International Search Report and Written Opinion issued in International Patent Application No. PCT/JP2016/000101, dated Feb. 16, 2016; with partial English translation.

*Primary Examiner* — Chia-Wei A Chen
(74) *Attorney, Agent, or Firm* — McDermott Will & Emery LLP

(57) ABSTRACT

Each of a plurality of analog-to-digital (AD) converters configuring a column AD converter used in an image sensor comprises: an oversampling AD converter that receives an output voltage of a pixel unit; a recursive AD converter that receives an analog residual signal of the oversampling AD converter; and a counter that adds a digital signal output from the oversampling AD converter and a digital signal output from the recursive AD converter. The controller dynamically allocates the number of bits of the oversampling AD converter and the number of bits of the recursive AD converter, while maintaining the total number of bits of the oversampling AD converter and the recursive AD converter.

6 Claims, 7 Drawing Sheets

(51) Int. Cl.
  *H03M 1/12* (2006.01)
  *H04N 5/3745* (2011.01)
  *H04N 5/376* (2011.01)
  *H04N 5/357* (2011.01)

(58) Field of Classification Search
  CPC ......... H03M 3/388; H03M 3/448; G02F 7/00; H04N 5/37455
  USPC .......................... 348/294–324; 341/155, 156
  See application file for complete search history.

(56) References Cited

U.S. PATENT DOCUMENTS

| | | | |
|---|---|---|---|
| 6,313,775 B1 * | 11/2001 | Lindfors | H03M 3/424 341/118 |
| 8,269,867 B2 | 9/2012 | Inada | |
| 9,521,337 B1 * | 12/2016 | Shen | H04N 5/3355 |
| 2003/0178645 A1 | 9/2003 | Shiohara | |
| 2005/0270215 A1 | 12/2005 | Wada et al. | |
| 2006/0227027 A1 * | 10/2006 | Doerrer | H03M 1/0668 341/143 |
| 2008/0043128 A1 * | 2/2008 | Poonnen | H03M 1/123 348/294 |
| 2009/0159782 A1 | 6/2009 | Murakami et al. | |
| 2013/0120180 A1 | 5/2013 | Kawahito | |
| 2013/0120625 A1 | 5/2013 | Ishii et al. | |
| 2013/0215286 A1 | 8/2013 | Ohya et al. | |
| 2014/0159931 A1 * | 6/2014 | Redfern | H03M 3/422 341/143 |
| 2014/0160334 A1 | 6/2014 | Wakabayashi | |
| 2015/0381200 A1 | 12/2015 | Goto et al. | |
| 2016/0344401 A1 * | 11/2016 | La Grou | H03M 1/08 |

FOREIGN PATENT DOCUMENTS

| | | |
|---|---|---|
| JP | 2009-159069 A | 7/2009 |
| JP | 2012-015586 A | 1/2012 |
| JP | 2012-060648 A | 3/2012 |
| JP | 2013-055589 A | 3/2013 |
| JP | 2013-172205 A | 9/2013 |
| WO | 2011/142452 A1 | 11/2011 |
| WO | 2014/141350 A1 | 9/2014 |

\* cited by examiner

IMAGE SENSOR AND IMAGING DEVICE COMPRISING OVERSAMPLING AD CONVERTER AND RECURSIVE AD CONVERTER

RELATED APPLICATIONS

This application is the Continuation of International Patent Application No. PCT/JP2016/000101, filed on Jan. 12, 2016, which in turn claims the benefit of Japanese Application No. 2015-056404, filed on Mar. 19, 2015 the disclosure of which Applications are incorporated by reference herein.

BACKGROUND

1. Technical Field

The present disclosure relates to an image sensor for imaging an object and an imaging device equipped with the image sensor.

2. Description of the Related Art

An image sensor has a photoelectric conversion element which converts an object image (light) to an analog electric signal, and an analog-to-digital (AD) converter which converts the analog electric signal to a digital signal. The image quality of an image captured by the image sensor depends largely on the performances of the AD converter. Accordingly, the AD converter mounted in the image sensor is required to have a high accuracy so that even weak light can be detected with high sensitivity.

International Publication No. WO2014/141350 discloses an AD converter configured by combining a delta-sigma converter which produces an upper-bit digital signal and a recursive AD converter which produces a lower-bit digital signal to perform in total a highly accurate analog-to-digital conversion.

SUMMARY

An image sensor in accordance with the present disclosure comprises: a pixel array that has a plurality of photoelectric conversion elements arranged in a matrix; a column analog-to-digital (AD) converter that has a plurality of AD converters and receives output voltages corresponding to pixels on one line of the pixel array; and a controller that controls the plurality of AD converters. Each of the plurality of AD converters has an oversampling AD converter that receives an output signal of the pixel array, a recursive AD converter that receives an analog residual signal of the oversampling AD converter, and a counter that adds a digital signal output from the oversampling AD converter and a digital signal output from the recursive AD converter. The controller dynamically allocates a number of bits of the oversampling AD converter and a number of bits of the recursive AD converter while maintaining a total number of bits of the oversampling AD converter and the recursive AD converter.

With this configuration, it is possible to provide an image sensor that makes it possible to improve the signal-to-noise (S/N) ratio without unnecessarily increasing the number of bits of the AD converter and also to realize a high frame rate.

DETAILED DESCRIPTION

Underlying Knowledge Forming Basis of the Present Invention

Image sensors used for security cameras or vehicle cameras are required to have a function for collecting specific information in an extreme environmental situation. For example, these image sensors are required to record clear object images so that a human face, a character or the like can be clearly recognized even in a dark environment. Also, in a case of capturing images of a rapidly moving object, the image sensors are required to record object images with less motion blurs so that a moving direction or a contour of the object can be recognized.

There are two methods for improving the clarity of an object image. One method is to increase the number of gradations of the image, or the number of bits of the digital output signal of the analog-to-digital (AD) converter in the image sensor. The other method is to reduce the noises of the output digital signal. Also, it is necessary for suppressing the motion blurs to increase the frame rate.

It is necessary for increasing the number of gradations of an image to increase both of the bit width of the counter used in the AD converter and the bit width of the transfer circuit for transferring the output digital signal. However, this results in a complex circuit configuration and a cost increase. On the other hand, it is effective for reducing the noises of the output digital signal to perform an oversampling AD conversion. However, such conversion is relatively low in conversion speed, so that it is hard to improve the frame rate.

In view of the above, it is required for the image sensor used for the security camera or the vehicle camera to improve the signal-to-noise (S/N) ratio without unnecessarily increasing the number of bits of the AD converter and also to realize a higher frame rate.

Hereinafter, exemplary embodiments will be described with reference to the accompanying drawings as appropriate. However, unnecessarily detailed description may occasionally be omitted. For example, detailed description of well-known matters and redundant description of substantially the same configuration may occasionally be omitted. This is to avoid the following description from becoming unnecessarily redundant, and to allow any person skilled in the art to easily understand the description.

Also, it should be noted that the following description and the accompanying drawings are provided to allow any person skilled in the art to fully understand the present disclosure, and that it is not intended to limit the subject matter described in the claims by the following description and the accompanying drawings.

First Exemplary Embodiment

A first exemplary embodiment will be described with reference to FIG. 1 to FIG. 5.

1-1. Configuration 1-1-1. Configuration of an Image Sensor

Figure 1:
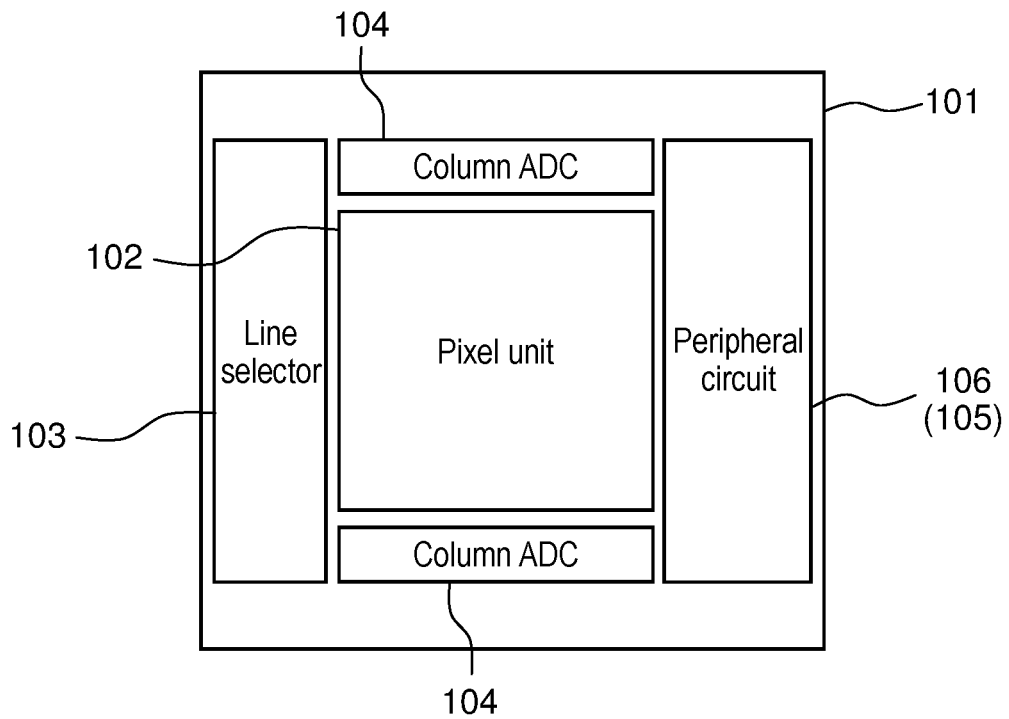
FIG. 1 is a schematic diagram illustrating an external appearance example of an image sensor in accordance with a first exemplary embodiment.
Figure 2:
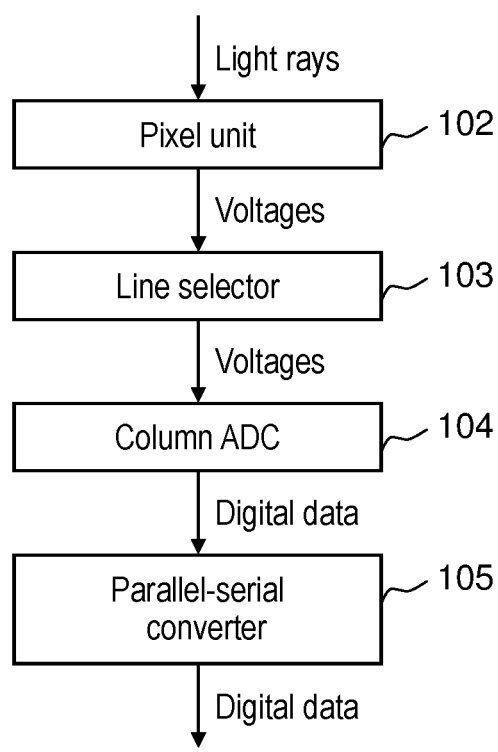
FIG. 2 is a block diagram illustrating a functional configuration of the image sensor shown in FIG. 1.

FIG. 1 is a schematic diagram illustrating an external appearance example of an image sensor. FIG. 2 is a block diagram illustrating a functional configuration of the image sensor shown in FIG. 1.

Image sensor 101 shown in FIG. 1 and FIG. 2 comprises pixel unit (pixel array) 102, line selector 103, column analog-to-digital converter (ADC) 104, and parallel-serial converter 105. Parallel-serial converter 105 is assumed to be included in peripheral circuit 106 in FIG. 1.

1-1-2. Configuration of an AD converter

Figure 3:
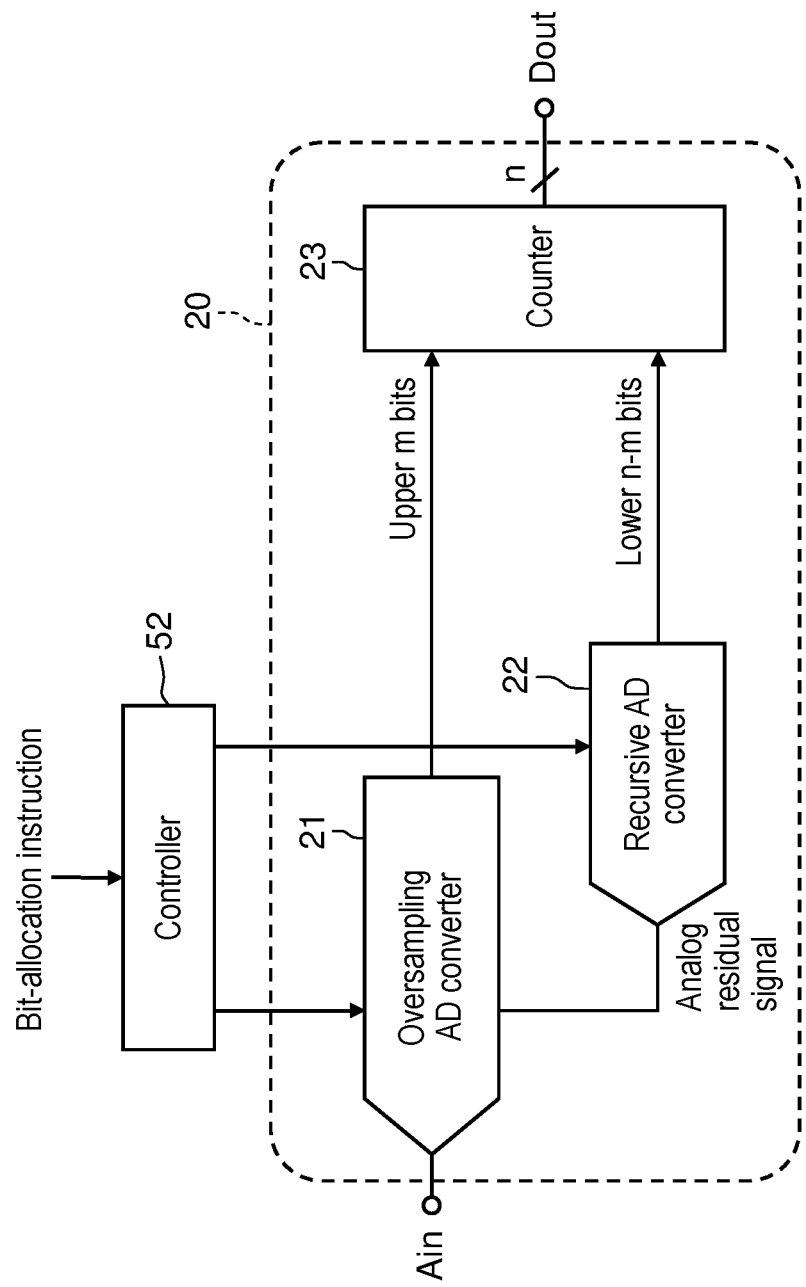
FIG. 3 is a block diagram illustrating a schematic configuration of an analog-to-digital (AD) converter configuring a column analog-to-digital converter (ADC)

FIG. 3 is a block diagram illustrating a schematic configuration of an analog-to-digital (AD) converter configuring column ADC 104.

AD converter 20 has oversampling AD converter 21, recursive AD converter 22, and counter 23. Also, controller 52 for controlling oversampling AD converter 21 and recursive AD converter 22 is provided in peripheral circuit 106 shown in FIG. 1. AD converter 20 is operable in an oversampling mode and a recursive conversion mode, which modes can be switched by controller 52. AD converter 20 converts input analog signal Ain (here, an output voltage from pixel unit 102) to output n-bit digital signal Dout.

Oversampling AD converter 21 receives input analog signal Ain and generates an upper m-bit digital signal, where m is an integer from 0 to n. Oversampling AD converter 21 samples the input signal at a sampling frequency higher than a Nyquist frequency. Therefore, quantization noises are shifted toward high frequency region (noise shaping), so that noises in a desired frequency band can be largely reduced. Accordingly, oversampling AD converter 21 is suitable for improving the signal-to-noise (S/N) ratio of a captured image.

Recursive AD converter 22 receives an analog residual signal of oversampling AD converter 21 and generates a lower (n−m)-bit digital signal. Recursive AD converter 22 provides a higher AD conversion speed compared to oversampling AD converter 21, but has less noise reducing effect. For example, oversampling AD converter 21 requires $\sqrt{2}^{N+1}$ clock cycles to determine an N-bit digital signal. Compared to this, recursive AD converter 22 needs only N+1 clock cycles to determine an N-bit digital signal. Accordingly, recursive AD converter 22 is suitable for improving the frame rate of captured images.

As will be described later, many of the components configuring oversampling AD converter 21 and recursive AD converter 22 can be used in common.

Counter 23 adds (combines) the upper m-bit digital signal output from oversampling AD converter 21 and the lower (n−m)-bit digital signal output from recursive AD converter 22 to output n-bit digital signal Dout.

Controller 52 dynamically allocates the number of bits of oversampling AD converter 21 and the number of bits of recursive AD converter 22 according to an externally given bit-allocation instruction, while maintaining the total number of bits (n bits) of oversampling AD converter 21 and recursive AD converter 22. Accordingly, referring to the configuration shown in FIG. 3, n is a fixed value, and m is a variable value.

1-2. Operations 1-2-1. Operations of the Image Sensor

Operations of image sensor 101 configured as above will be described hereinafter.

First, a plurality of photoelectric conversion elements (e.g., photodiodes) which are arranged in a matrix in pixel unit 102 receive input light and output corresponding voltages to line selector 103.

Then, line selector 103 outputs to column ADC 104 output voltages corresponding to pixels in one line of pixel unit 102. Column ADC 104 is configured with a plurality of AD converters, and performs analog-to-digital conversion of the above-mentioned output voltages to output digital data. Parallel-serial converter 105 converts the output digital data into a serial signal, which is output from the image sensor 101.

1-2-2. Operations of the AD Converter

Next, operations of AD converter 20 will be described hereinafter.

Figure 4:
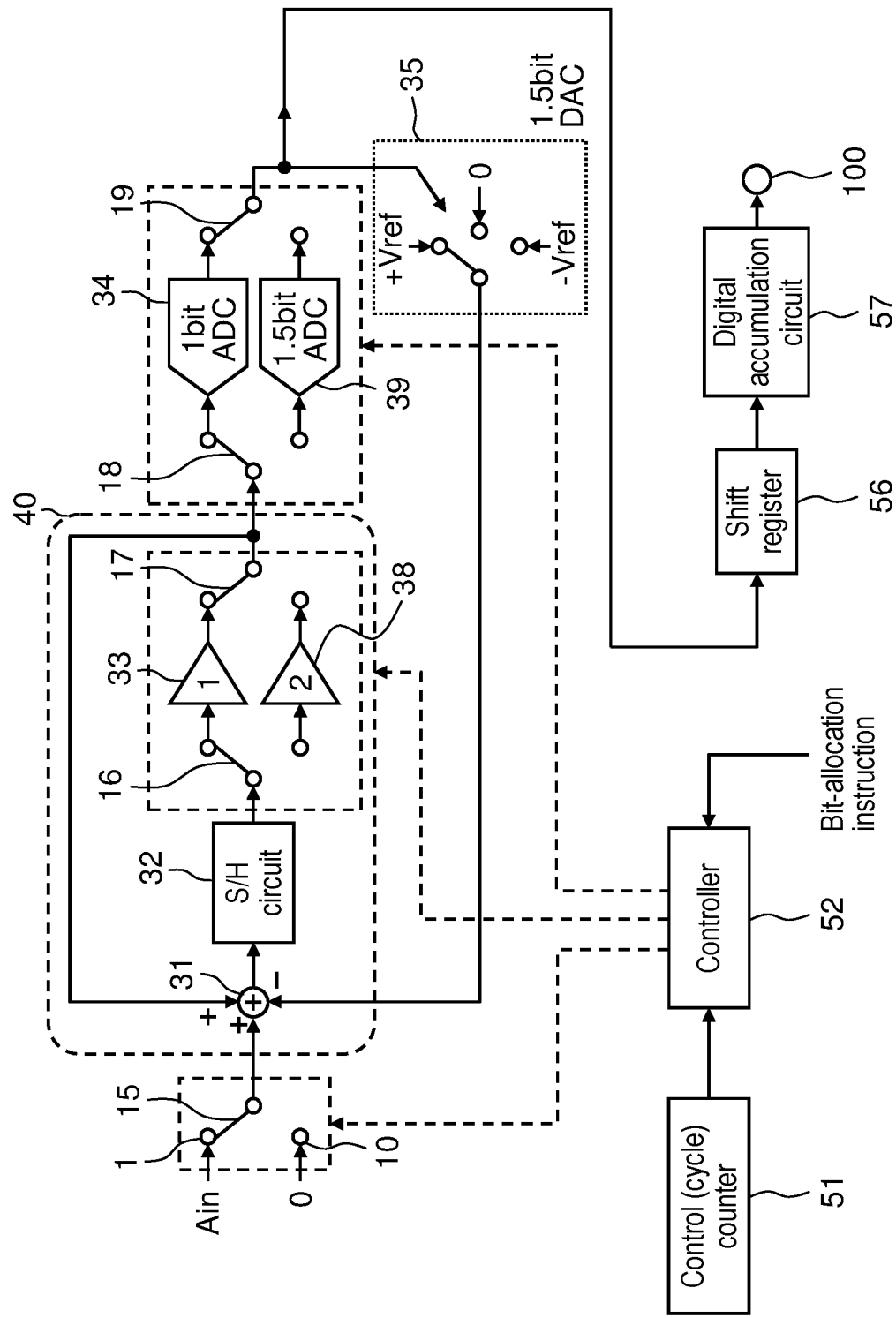
FIG. 4 is a block diagram illustrating a schematic configuration of the AD converter in an oversampling mode.
Figure 5:
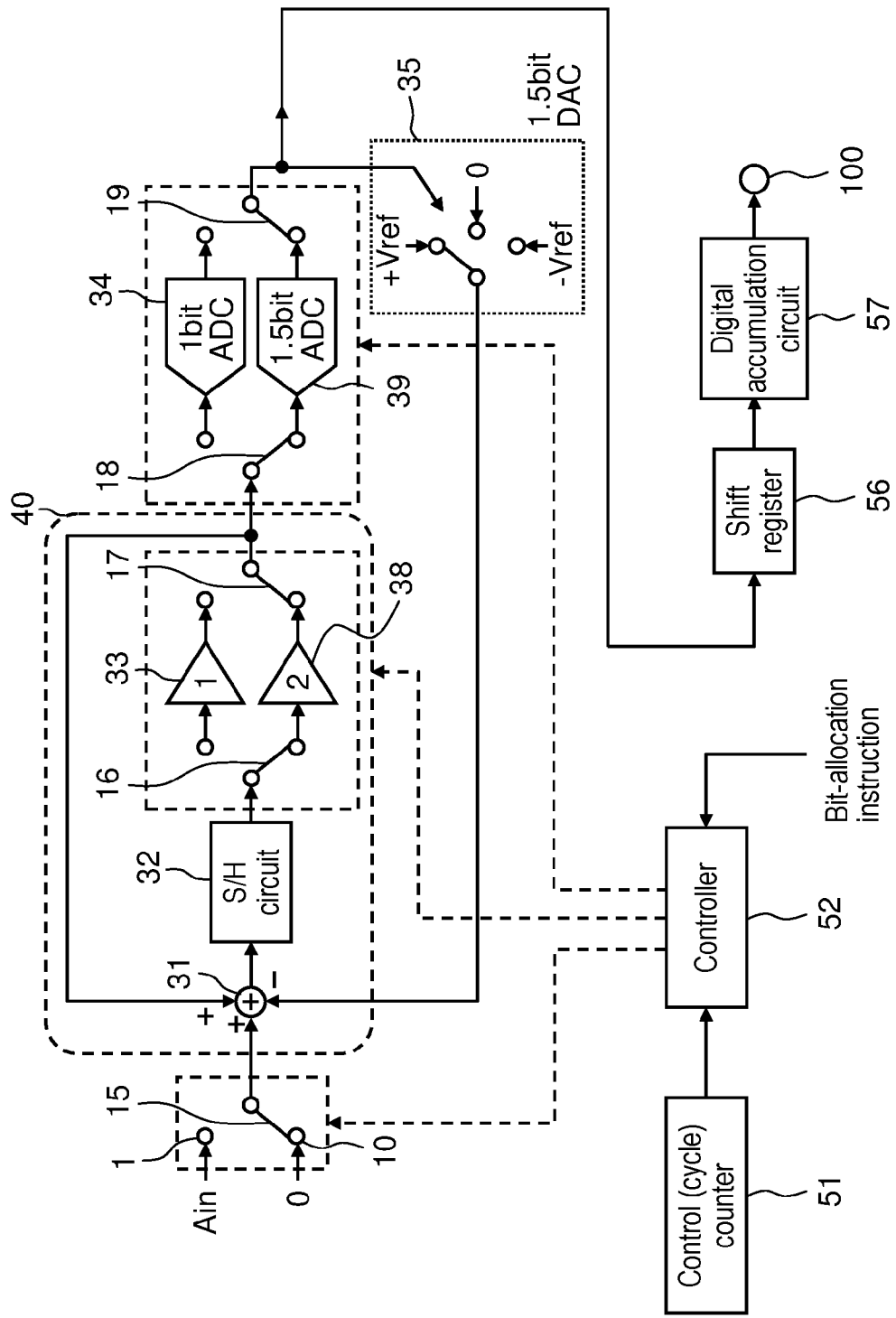
FIG. 5 is a block diagram illustrating a schematic configuration of the AD converter in a recursive conversion mode.

FIG. 4 is a block diagram illustrating a schematic configuration of AD converter 20 operating in an oversampling mode. FIG. 5 is a block diagram illustrating a schematic configuration of AD converter 20 operating in a recursive conversion mode. AD converters 20 shown in FIG. 4 and FIG. 5 have the same circuit configuration, and differ from each other only in the connection states of switches.

AD converter 20 has switches 15 to 19, subtractor 31, sample and hold (S/H) circuit 32, amplifiers 33, 38, sub-AD converters 34, 39, and sub-digital-to-analog (sub-DA) converter 35.

Also, control (cycle) counter 51, controller 52, shift register 56, and digital accumulation circuit 57 are provided in peripheral circuit 106 shown in FIG. 1.

Referring to FIG. 4 and FIG. 5, control (cycle) counter 51 counts the number of cycles of externally given clocks (not shown) from the start of the conversion. Controller 52 controls each component of AD converter 20 based on a count output of cycle counter 51 and the externally given bit-allocation instruction. AD converter 20 performs the analog-to-digital converting operation while operation mode of controller 52 is switched between the oversampling mode or the recursive conversion mode.

Oversampling Mode:

In a case where the number of bits allocated to oversampling AD converter 21 is not zero, or m>0, AD converter 20 operates in the oversampling mode as described below.

In the oversampling mode, as shown in FIG. 4, switch 15 is connected to input terminal 1, so that analog input signal Ain at input terminal 1 is given to subtractor 31. An output signal of subtractor 31 is given to sample and hold circuit 32, and held by sample and hold circuit 32. The held signal is given through switch 16 to amplifier 33 to be amplified by a gain of 1. Here, feedback from an output signal of amplifier 33 to subtractor 31 configures analog accumulation circuit 40 to perform as an analog accumulation circuit with a gain of 1.

The output signal of amplifier 33 is given through switch 17 and switch 18 to sub-AD converter 34 which performs a 1-bit AD conversion. Sub-AD converter 34 outputs a binary (1 bit) digital signal indicating either "+1" or "31 1".

The output digital signal of sub-AD converter 34 is given through switch 19 to sub-DA converter 35. Sub-DA converter 35 outputs a reference voltage "+Vref" or "−Vref"

depending on the input 1-bit digital signal. Here, sub-DA converter 35 has been reset to "0" before receiving an input digital signal for the first time.

The output signal of sub-DA converter 35 is given to subtractor 31, so that subtractor 31 outputs a difference signal between analog input signal Ain and the output signal of sub-DA converter 35.

In the manner as described above, a closed loop of delta sigma modulation is configured with subtractor 31, sample and hold circuit 32, amplifier 33, sub-AD converter 34, and sub-DA converter 35.

Shift register 56 shifts the output digital signal of sub-AD converter 34 from the most significant bit (MSB) toward the least significant bit (LSB) (right shift) by m−1 bits which is a bit width allocated to oversampling AD converter 21 in synchronization with an externally given clock signal (not shown). Digital accumulation circuit 57 integrates the output digital signal of shift register 56. Shift register 56 and digital accumulation circuit 57 are components of counter 23 shown in FIG. 3.

The above-described operations constitute one cycle in the oversampling mode, and $2^m$ cycles of operations determine the upper m-bit digital signal.

Recursive Conversion Mode:

In a case where the number of bits allocated to recursive AD converter 22 is not zero, or m<n, AD converter 20 operates in the recursive conversion mode as described below after the operations in the above-described oversampling mode. In a case where all bits (n bits) are allocated to recursive AD converter 22, however, AD converter 20 operates only in the recursive conversion mode, without operating in the above-described oversampling mode.

In the recursive conversion mode, as shown in FIG. 5, switch 15 is connected to input terminal 10. Since the input signal at input terminal 10 is zero, sample and hold circuit 32 holds the difference between the output of amplifier 38 and the output of sub-DA converter 35. The held signal is given through switch 16 to amplifier 38 to be amplified by a gain of 2. Here, feedback from an output signal of amplifier 38 to subtractor 31 configures analog accumulation circuit 40 to perform as an analog accumulation circuit with a gain of 2.

In this way, an input of recursive AD converter 22 is substantially equal to an analog residual signal of oversampling AD converter 21 by setting the input signal at input terminal 10 to zero ("0") after completing the operations in the oversampling mode.

The output signal of amplifier 38 is given through switch 17 and switch 18 to sub-AD converter 39 which performs a 1.5-bit AD conversion. Sub-AD converter 39 outputs a ternary (1.5 bits) digital signal indicating either "+1", "0" or "−1".

The output digital signal of sub-AD converter 39 is given through switch 19 to sub-DA converter 35. Sub-DA converter 35 outputs a reference voltage "+Vref" or "0" or "−Vref" depending on the input 1.5-bit digital signal.

In the manner as described above, a closed loop of recursive conversion mode with a gain of 2 with configured by subtractor 31, sample and hold circuit 32, amplifier 38, sub-AD converter 39, and sub-DA converter 35.

Shift register 56 shifts the output digital signal of sub-AD converter 39 to the right by the number of bits obtained by adding the current number of cycles in the recursive conversion mode and the number of m−1, where m is the number of bits allocated to oversampling AD converter 21. Digital accumulation circuit 57 integrates output digital signals of shift register 56.

The above-described operations constitute one cycle in the recursive conversion mode, and n−m cycles of operations determine the lower (n−m)-bit digital signal.

At the time the above-described operations in the oversampling mode and the recursive conversion mode have been completed, an n-bit digital signal is output from output terminal 100. The output n-bit digital signal is temporarily stored in a memory (not shown). Then, a shift register (not shown) shifts the n-bit digital signal, which is stored in the memory, and outputs the digital signal to parallel-serial converter 105. Parallel-serial converter 105 converts the digital signal to a serial signal, which is output from the image sensor 101.

1-3. Advantageous Effects and Others

As described hereinbefore, image sensor 101 in accordance with the present exemplary embodiment comprises pixel unit 102, column ADC 104, and controller 52. AD converter 20 which is a member of column ADC 104 has oversampling AD converter 21 that receives an output voltage from pixel unit 102, recursive AD converter 22 that receives an analog residual signal of oversampling AD converter 21, and counter 23 that adds a digital signal output from oversampling AD converter 21 and a digital signal output from recursive AD converter 22. Controller 52 dynamically allocates the number of bits of oversampling AD converter 21 and the number of bits of recursive AD converter 22 while maintaining the total number of bits of oversampling AD converter 21 and recursive AD converter 22.

With this configuration, the quality of the captured image can be improved by allocating more bits to oversampling AD converter to improve S/N ratio of AD conversion. Also, the frame rate can be improved by allocating more bits to recursive AD converter to realize high speed AD conversion. In other words, the AD converter 20 can realize either an improved S/N ratio or a higher frame rate without unnecessarily increasing the number of bits of AD converter 20.

Second Exemplary Embodiment

Hereinafter, a second exemplary embodiment will be described with reference to FIG. 6 to FIG. 9.

2-1. Configuration

Figure 6:
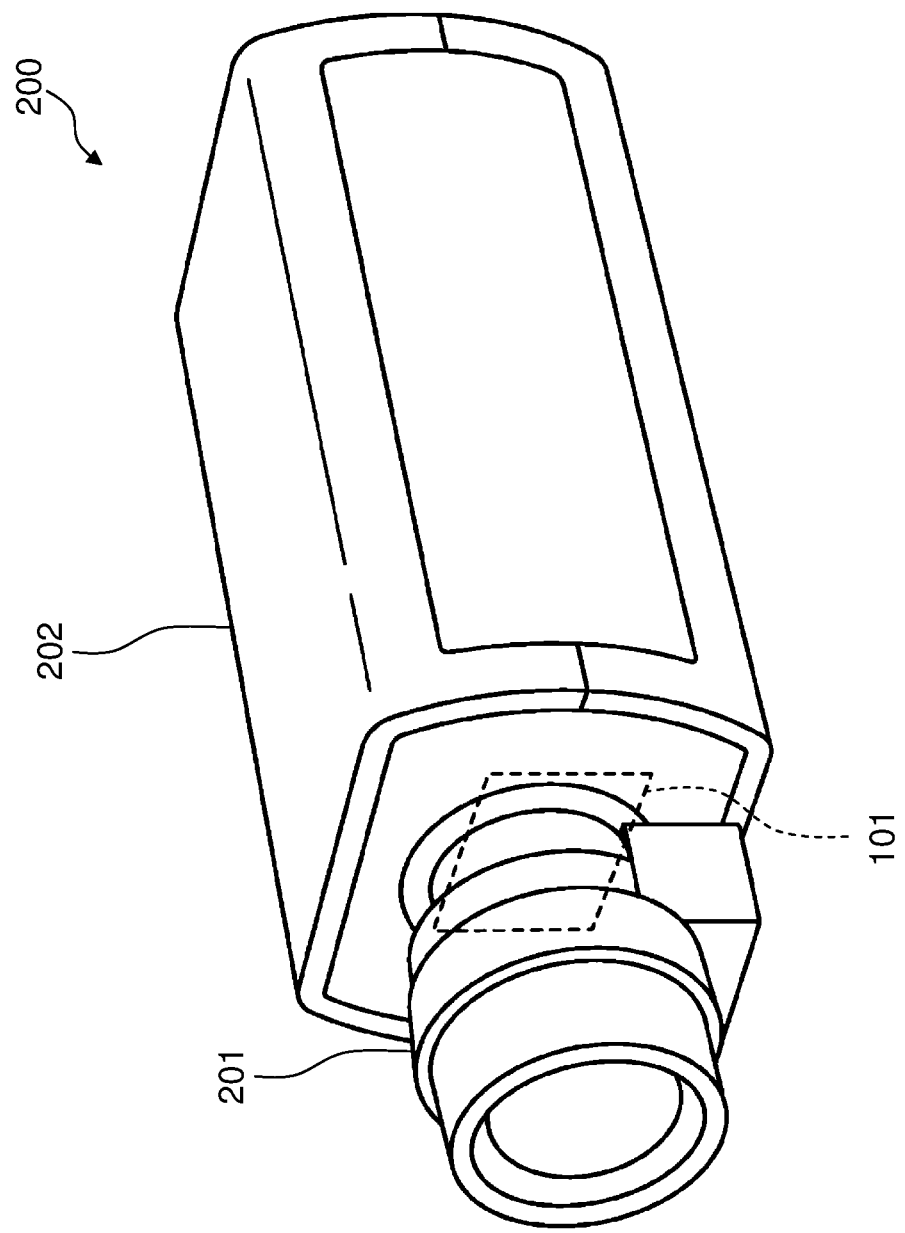
FIG. 6 is an external view of a security camera in accordance with a second exemplary embodiment.

FIG. 6 is an external view of security camera 200 in accordance with the second exemplary embodiment. As shown in FIG. 6, security camera 200 comprises interchangeable lens (image-forming optical system) 201, and camera body 202 to which interchangeable lens 201 can be attached. Interchangeable lens 201 is configured to include a varifocal lens (variable focus lens) (not shown), and an actuator for autofocusing. Camera body 202 has built-in image sensor 101 in accordance with the first exemplary embodiment. Camera body 202 also has a power supply device, a processor (not shown) for processing compression coding and noise reduction of image data, and a communication device for connecting security camera 200 to a network such, for example, as a LAN(Local Area Network) or an internet.

2-2. Operations

Operations of security camera 200 configured as above will be described hereinafter. Security camera 200 is attached, for example, to a ceiling or a wall of a room to be used for indoor monitoring. Interchangeable lens 201 automatically focuses on an object, and collects light from the object to form an image of the object on image sensor 101. Image sensor 101 detects the image of the object, and converts the image to an image data by photoelectric conversion. The image data is processed by the processor in camera body 202, and the processed image data is transmitted through the communication device to a server (not shown).

Image sensor 101 has imaging modes as shown in TABLE 1. An image quality highest-priority mode is a mode which realizes high S/N ratio to obtain clear image of the object but cases lower frame rate which prevents high speed imaging. On the other hand, a frame rate highest-priority mode is a mode which realizes high frame rate to perform high speed imaging but causes inferior S/N ratio which degrades clarity of the object image. Each of an image quality moderate-priority mode and a frame rate moderate-priority mode is a mode in which the S/N ratio and the frame rate are balanced.

As shown in TABLE 1, there are one-to-one correspondences between the imaging modes and the bit-allocation instructions given to controller 52 of image sensor 101. In a case where the imaging mode is the image quality moderate-priority mode, for example, controller 52 receives a bit-allocation instruction which allocates "8" bits to oversampling analog-to-digital (AD) converter 21 and "4" bits to recursive AD converter 22. In a case where the imaging mode is the frame rate moderate-priority mode, for example, controller 52 receives a bit-allocation instruction which allocates "4" bits to oversampling AD converter 21 and "8" bits to recursive AD converter 22. The processor in camera body 202 or a server connected to the network may appropriately select the imaging mode by analyzing the object image captured by image sensor 101, and send the bit-allocation instruction as described above to controller 52.

Since the total number of bits of AD converter 20 is a fixed value, the bit-allocation instruction may instruct either one of the number of bits allocated to oversampling AD converter 21 or the number of bits allocated to recursive AD converter 22. As another manner, merely the imaging mode may be instructed, and controller 52 may select the number of bits corresponding to the instructed imaging mode.

Figure 7:
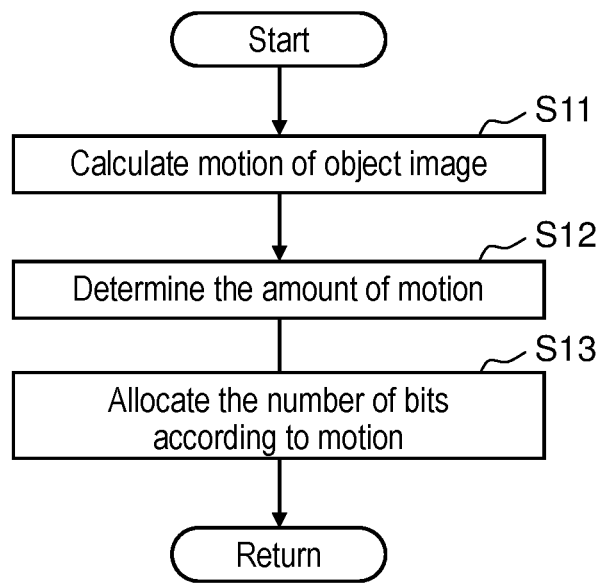
FIG. 7 is a flowchart for explaining an imaging operation of the security camera in accordance with the second exemplary embodiment.

FIG. 7 is a flowchart for explaining an imaging operation of security camera 200. For example, the imaging mode may be selected based on a motion of the object image.

First, the above-mentioned processor or server calculates a motion of an object image from the latest several frames (S11). In a case where security camera 200 has a moving picture recording function compliant with H.264 or the like, for example, it is possible to evaluate a motion of the object image by using a motion vector which is calculated in the encoding process of the moving picture data. Even in a case where security camera 200 does not have the moving picture recording function, it is possible to evaluate a motion of the object image by calculating a motion vector using the latest several frames according to H.264 or the like.

Once the motion of the object image has been evaluated, the processor or server determines the amount of the motion of the object image (S12). For example, the processor or server can classify the amount of the motion of the object image into four levels using three threshold values.

Once the amount of the motion of the object image has been determined, the processor or server selects a corresponding imaging mode, and sends a bit-allocation instruction to controller 52. In response to this instruction, controller 52 allocates the number of bits of oversampling AD converter 21 and the number of bits of recursive AD converter 22 according to the amount of the motion of the object image (S13).

Figure 8:
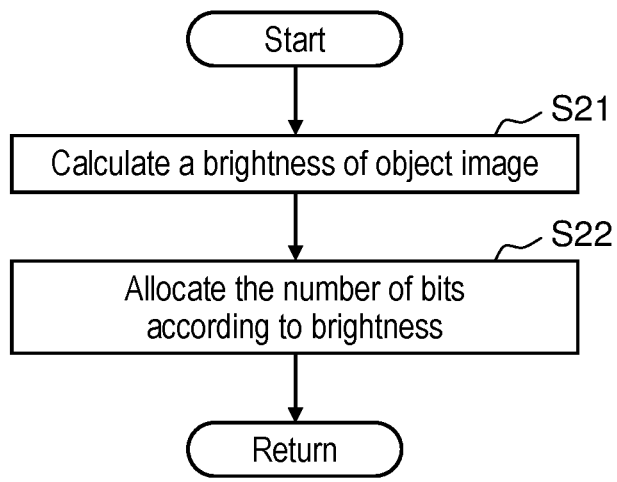
FIG. 8 is a flowchart for explaining another imaging operation of the security camera in accordance with the second exemplary embodiment.

FIG. 8 is a flowchart for explaining another imaging operation of security camera 200. For example, the imaging mode may be selected based on a brightness of the object image.

First, the processor or server calculates a brightness of the object image (S21). For example, the processor or server may use a gamma correction value of the object image as the brightness of the object image.

Once the brightness of the object image has been calculated, the processor or server selects an imaging mode corresponding to the brightness of the object image, and sends a bit-allocation instruction to controller 52. In response to this instruction, controller 52 allocates the number of bits of oversampling AD converter 21 and the number of bits of recursive AD converter 22 according to the brightness of the object image (S22).

Figure 9:
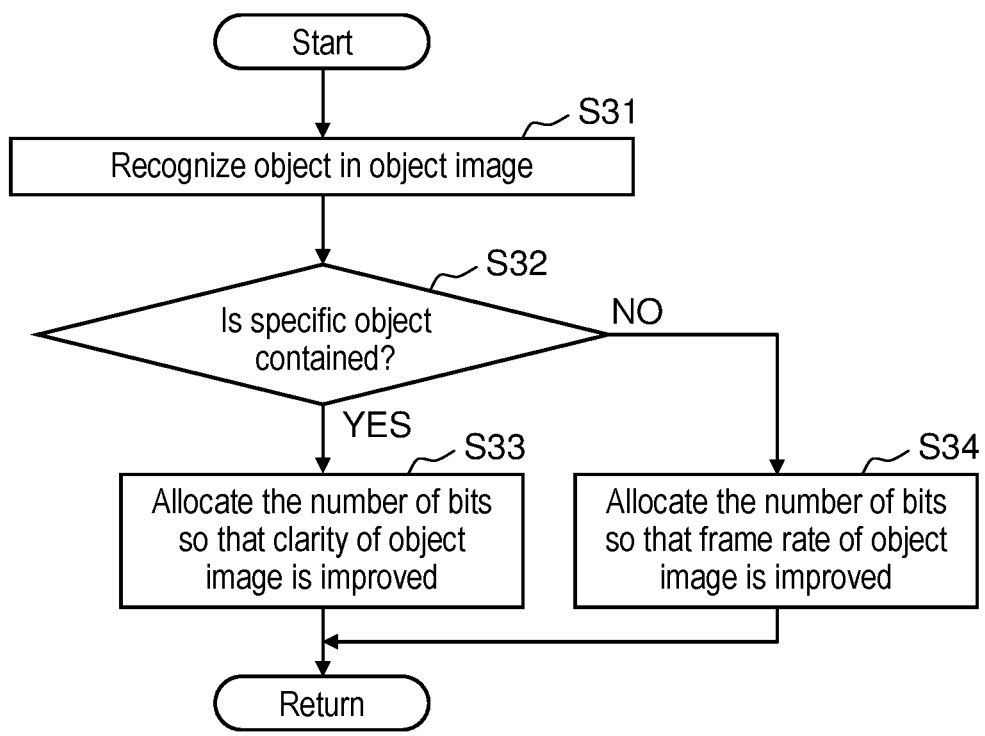
FIG. 9 is a flowchart for explaining still another imaging operation of the security camera in accordance with the second exemplary embodiment.

FIG. 9 is a flowchart for explaining still another imaging operation of security camera 200. For example, the processor or server may select the imaging mode according to whether or not the object image contains a specific object (e.g., a human face or a license plate of a car).

First, the processor or server recognizes an object in the object image (S31). A known pattern recognition technique may be used to recognize the object.

In a case where a specific object such, for example, as a human face or a license plate of a car is contained in the object image (YES in S32), the processor or server selects the image quality highest-priority mode or the image quality moderate-priority mode as the imaging mode, and sends a bit-allocation instruction to controller 52. In response to this instruction, controller 52 allocates the number of bits of oversampling AD converter 21 and the number of bits of recursive AD converter 22 so that the clarity of the object image is improved (S33).

On the other hand, in a case where a specific object such, for example, as a human face or a license plate of a car is not contained in the object image (NO in S32), the processor or server selects the frame rate highest-priority mode or the frame rate moderate-priority mode as the imaging mode, and sends a bit-allocation instruction to controller 52. In response to this instruction, controller 52 allocates the number of bits of oversampling AD converter 21 and the number of bits of recursive AD converter 22 so that the frame rate of the object image is improved (S34).

2-3. Advantageous Effects and Others

According to the present exemplary embodiment, as described hereinabove, it is possible by mounting image sensor 101 in accordance with the first exemplary embodiment into security camera 200 to appropriately increase the S/N ratio so that the clarity of the object image is improved or to increase the frame rate so that motion blurs are suppressed, according to the features of the object image.

Other Exemplary Embodiments

As described hereinabove, the first and second exemplary embodiments have been described for the purpose of showing examples of techniques to be disclosed in the present application. However, techniques in accordance with the present disclosure are not limited to the techniques of these exemplary embodiments, and are applicable to other exemplary embodiments in which various modifications, substitutions, additions, and/or omissions may appropriately be made. Further, the structural components described in the above first and second exemplary embodiments may be combined to configure a new exemplary embodiment.

Some examples of such other exemplary embodiments will be shown below.

Although column analog-to-digital converters (ADCs) are provided at both sides of pixel unit 102 in image sensor 101 shown in FIG. 1, column ADC 104 may be provided at only one side of pixel unit 102.

Although it has been described that oversampling analog-to-digital (AD) converter 21 is configured with a delta sigma AD converter in AD converter 20 in accordance with the first exemplary embodiment, oversampling AD converter 21 may be configured with another type of AD converter. Also, recursive AD converter 22, which has been described to be configured with a cyclic AD converter, may be configured with, for example, a successive approximation AD converter or the like.

Although security camera 200 has been described as an imaging device having image sensor 101 mounted in it in the second exemplary embodiment, the application field of image sensor 101 may not be limited to security camera 200. Image sensor 101 may be mounted into various devices including, for example, vehicle cameras, studio cameras, business cameras, digital video cameras, smartphones, and tablet personal computers (PCs).

In the above description, the exemplary embodiments have been described as examples of techniques according to the present disclosure. For the purpose of the description, the accompanying drawings and the detailed description have been provided.

Accordingly, the components shown in the drawings and described in the detailed description may include not only components that are essential, but also components that are not essential, to exemplify the above-mentioned techniques. Therefore, it should not immediately recognized that such non-essential components are essential merely for the reason that they are shown in the drawings or described in the detailed description.

Also, since the above-described exemplary embodiments are for exemplifying the techniques according to the present disclosure, various modifications, substitutions, additions or omissions may be made within the scope of the claims and equivalents thereof.

The present disclosure is applicable to imaging devices. Specifically, the present disclosure is applicable to security cameras, vehicle cameras, studio cameras, business cameras, digital still cameras, camcorders, mobile phones with a camera function, smartphones with a camera function, and the like.

What is claimed is:

1. An image sensor comprising:
   a pixel array that has a plurality of photoelectric conversion elements arranged in a matrix;
   a column analog-to-digital (AD) converter that has a plurality of AD converters and receives output voltages corresponding to pixels on one line of the pixel array; and
   a controller that controls the plurality of AD converters,
   wherein each of the plurality of AD converters comprises an oversampling AD converter that receives an output voltage of the pixel array, a recursive AD converter that receives an analog residual signal of the oversampling AD converter, and a counter that adds a digital signal output from the oversampling AD converter and a digital signal output from the recursive AD converter, and
   wherein the controller dynamically allocates a number of bits of the oversampling AD converter and a number of bits of the recursive AD converter while maintaining a total number of bits of the oversampling AD converter and the recursive AD converter.

2. The image sensor according to claim 1, wherein the controller adjusts a number of pulses of an operating clock signal supplied to the oversampling AD converter and the recursive AD converter according to the number of bits to be allocated to the oversampling AD converter and the number of bits to be allocated to the recursive AD converter.

3. An imaging device comprising:
   an image-forming optical system; and
   the image sensor according to claim 1 that receives an object image formed by the image-forming optical system.

4. The imaging device according to claim 3, wherein the controller allocates the number of bits of the oversampling AD converter and the number of bits of the recursive AD converter according to an amount of a motion of the object image.

5. The imaging device according to claim 3, wherein the controller allocates the number of bits of the oversampling AD converter and the number of bits of the recursive AD converter according to a brightness of the object image.

6. The imaging device according to claim 3, wherein the controller allocates the number of bits of the oversampling AD converter and the number of bits of the recursive AD converter according to whether or not the object image contains a specific object.

* * * * *